(12) United States Patent
Kim et al.

(10) Patent No.: US 10,303,020 B2
(45) Date of Patent: May 28, 2019

(54) DISPLAY DEVICE AND MANUFACTURING METHOD OF THE SAME

(71) Applicant: SAMSUNG DISPLAY CO., LTD., Yongin-si, Gyeonggi-do (KR)

(72) Inventors: Jangil Kim, Asan-si (KR); Suwan Woo, Suwon-si (KR); Keunwoo Park, Incheon (KR); Yeogeon Yoon, Suwon-si (KR); Taekyung Yim, Seoul (KR); Jonghak Hwang, Yongin-si (KR)

(73) Assignee: Samsung Display Co., Ltd. (KR)

( * ) Notice: Subject to any disclaimer, the term of this patent is extended or adjusted under 35 U.S.C. 154(b) by 13 days.

(21) Appl. No.: 15/624,447

(22) Filed: Jun. 15, 2017

(65) Prior Publication Data
US 2017/0363923 A1   Dec. 21, 2017

(30) Foreign Application Priority Data
Jun. 16, 2016   (KR) .................. 10-2016-0075121

(51) Int. Cl.
*G02F 1/1335*   (2006.01)
*G02F 1/1362*   (2006.01)
*G02F 1/1339*   (2006.01)
*G02F 1/1368*   (2006.01)
*H01L 27/12*    (2006.01)
(Continued)

(52) U.S. Cl.
CPC ...... *G02F 1/136209* (2013.01); *G02F 1/1368* (2013.01); *G02F 1/13394* (2013.01); *G02F 1/136227* (2013.01); *G02F 1/136286* (2013.01); *H01L 27/124* (2013.01); *G02F 1/133707* (2013.01); *G02F 2001/133354* (2013.01);
(Continued)

(58) Field of Classification Search
CPC ........ H01J 9/20; H01J 9/02; H01J 2893/0022; G02F 1/13306; G02F 1/1339
See application file for complete search history.

(56) References Cited

U.S. PATENT DOCUMENTS 7,576,824 B2 *  8/2009  Kim .................. G02F 1/134363
                                                           349/106
8,023,092 B2     9/2011  Tatemori et al.
(Continued)

FOREIGN PATENT DOCUMENTS

KR   10-2000-0066397 A   11/2000
KR   10-2009-0060159 A    6/2009
(Continued)

*Primary Examiner* — Selim U Ahmed
(74) *Attorney, Agent, or Firm* — Innovation Counsel LLP

(57) ABSTRACT

A display device includes: a base substrate comprising a first light blocking area extending in a first direction, a second light blocking area extending in a second direction intersecting the first direction and a light transmitting area defined by the first light blocking area and the second light blocking area; a gate line on the base substrate at the first light blocking area; a data line on the base substrate at the second light blocking area; a thin film transistor connected to the gate line and the data line; a protective layer on the thin film transistor; a black matrix on the protective layer at at least one of the first light blocking area and the second light blocking area; and a pixel electrode connected to the thin film transistor through a contact hole defined in the protective layer and the black matrix.

21 Claims, 8 Drawing Sheets

(51) Int. Cl.
*G02F 1/1337* (2006.01)
*G02F 1/1333* (2006.01)

(52) U.S. Cl.
CPC ............ *G02F 2001/136295* (2013.01); *G02F 2201/123* (2013.01)

(56) References Cited

U.S. PATENT DOCUMENTS 9,515,028 B2 * 12/2016 Choi ........................ H01L 21/77
2013/0308073 A1 * 11/2013 Yamazaki ............. H01L 27/323
349/46

FOREIGN PATENT DOCUMENTS

KR    10-2009-0115682 A    11/2009
KR    10-2013-0013110 A    2/2013

* cited by examiner

DISPLAY DEVICE AND MANUFACTURING METHOD OF THE SAME

CROSS-REFERENCE TO RELATED APPLICATION

This application claims priority under 35 U.S.C. § 119 to Korean Patent Application No. 10-2016-0075121, filed on Jun. 16, 2016, in the Korean Intellectual Property Office (KIPO), the disclosure of which is incorporated by reference herein in its entirety.

1. TECHNICAL FIELD

Exemplary embodiments of the present inventive concept relate to a display device and a method of manufacturing the display device, and more particularly, a display device and a method of manufacturing the display device that may simplify the manufacturing process.

2. DISCUSSION OF RELATED ART

Display devices may be classified into liquid crystal display ("LCD") devices, organic light emitting diode ("OLED") display devices, plasma display panel ("PDP") devices, electrophoretic display devices, and the like based on a light emitting scheme thereof.

The LCD device includes a display substrate on which an electrode is formed, an opposing substrate and a liquid crystal layer disposed between the display substrate and the opposing substrate. In recent times, a color filter on array (COA) structure in which a color filter is disposed on the display substrate to increase transmittance is employed.

In addition, in order to substantially prevent misalignment in the process of coupling the display substrate on which the color filter is disposed and the opposing substrate on which a light blocking member is disposed, a black matrix on array (BOA) structure in which a color filter and a light blocking member are disposed on the display substrate is employed.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments of the present inventive concept may be directed to a display device that may simplify the manufacturing process and to a method of manufacturing the same.

According to an exemplary embodiment, a display device includes: a base substrate comprising a first light blocking area extending in a first direction, a second light blocking area extending in a second direction intersecting the first direction and a light transmitting area defined by the first light blocking area and the second light blocking area; a gate line disposed on the base substrate at the first light blocking area; a data line disposed on the base substrate at the second light blocking area; a thin film transistor connected to the gate line and the data line; a protective layer disposed on the thin film transistor; a black matrix disposed on the protective layer at at least one of the first light blocking area and the second light blocking area; and a pixel electrode disposed on the black matrix and connected to the thin film transistor through a contact hole defined in the protective layer and the black matrix.

The display device may further include a light blocking pattern disposed on the base substrate and overlapping an area at which the thin film transistor contacts the pixel electrode. The light blocking pattern may overlap at least a part of the black matrix.

The light blocking pattern may completely overlap cover the area at which the thin film transistor contacts the pixel electrode in a plan view.

The light blocking pattern may be disposed in a substantially same layer as a layer in which the gate line is disposed.

The light blocking pattern may have an island shape.

The light blocking pattern may have a circular or polygonal shape.

The protective layer may include a first protective layer at the light transmitting area and a second protective layer at the first light blocking area and the second light blocking area.

The first protective layer may have a less height than a height of the second protective layer. The first protective layer may have a less height than a height of the second protective layer. The step difference may be from about 5000 Å to about 10000 Å.

The display device may further include a column spacer protruding from the black matrix.

According to another exemplary embodiment, a method of manufacturing a display device includes: preparing a base substrate comprising a first light blocking area extending in a first direction, a second light blocking area extending in a second direction intersecting the first direction and a light transmitting area defined by the first light blocking area and the second light blocking area; forming a gate line on the base substrate at the first light blocking area; forming a data line on the base substrate at the second light blocking area; forming a thin film transistor connected to the gate line and the data line; forming a protective layer and a black matrix on the thin film transistor; and forming a pixel electrode connected to the thin film transistor through a contact hole defined in the protective layer and the black matrix.

The forming a protective layer and the black matrix may include: sequentially forming a protective layer forming material and a black matrix forming material; and disposing a mask comprising a light transmitting portion, a semi-light transmitting material, exposing the black matrix forming material using a mask including a light transmitting portion, a semi-light transmitting portion and a light blocking portion, and developing the black matrix forming material.

The method may further include forming an insulating layer on the data line, and etching the insulating layer using the developed black matrix forming material as an etching mask to expose a drain electrode of the thin film transistor.

The method may further include partially removing the developed black matrix forming material on the first light blocking area and the second light blocking area, and completely removing the developed black matrix forming material on the light transmitting area.

The method may further include partially removing the protective layer on the light transmitting area.

The protective layer may include a first protective layer at the light transmitting area and a second protective layer at the first light blocking area and the second light blocking area, and the first protective layer may have a less height than a height of the second protective layer.

The method may further include forming a light blocking pattern on the base substrate and overlapping a contact area of the thin film transistor and the pixel electrode.

The light blocking pattern may be formed in a substantially same process as a process in which the gate line is formed.

The light blocking pattern may completely cover the exposed drain electrode of the thin film transistor in a plan view.

The foregoing is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

A more complete appreciation of the present inventive concept will become more apparent by describing in detail exemplary embodiments thereof with reference to the accompanying drawings, wherein.

DETAILED DESCRIPTION

Figure 1:
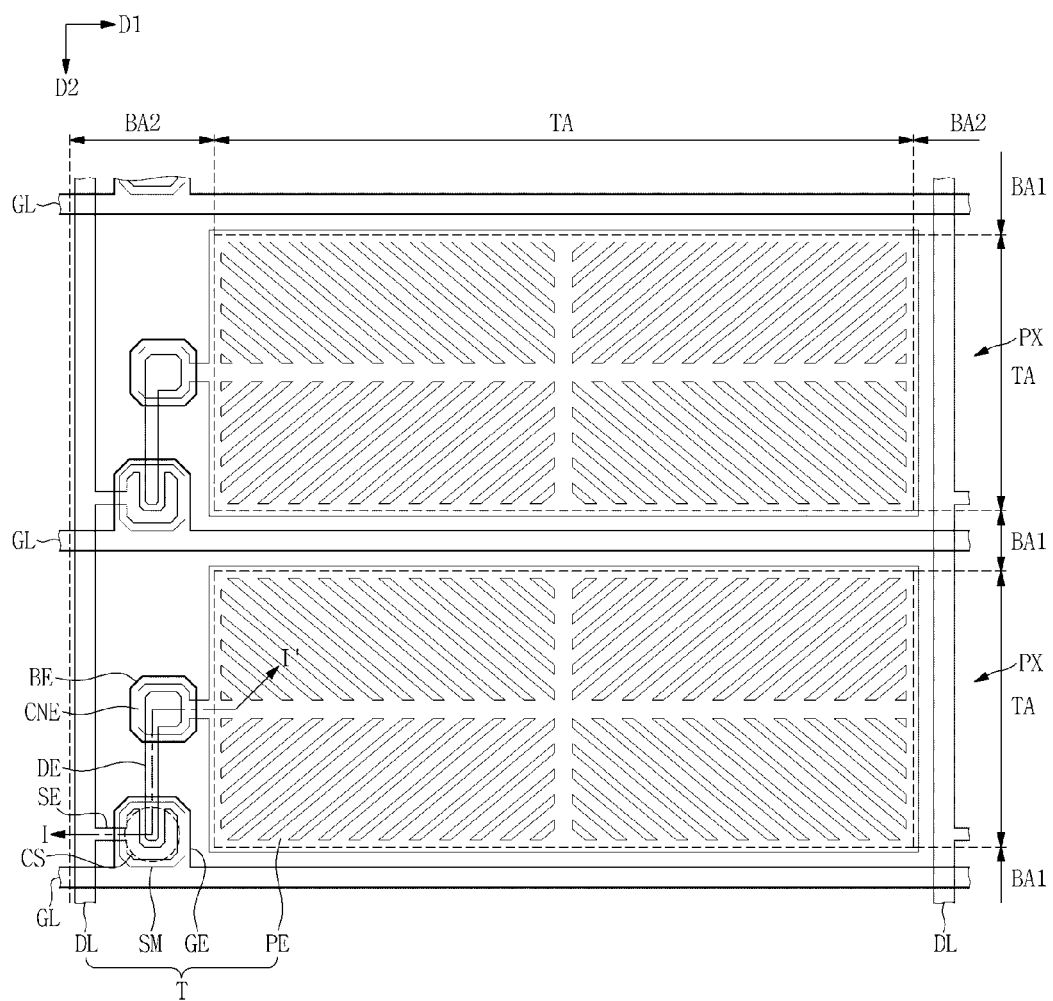
FIG. 1 is a schematic plan view illustrating a display device according to an exemplary embodiment.

Exemplary embodiments will now be described more fully hereinafter with reference to the accompanying drawings. Although the inventive concept may be modified in various manners and have several exemplary embodiments, exemplary embodiments are illustrated in the accompanying drawings and will be mainly described in the specification. However, the scope of the inventive concept is not limited to the exemplary embodiments and should be construed as including all the changes, equivalents, and substitutions included in the spirit and scope of the inventive concept.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have the same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe exemplary embodiments of the present inventive concept, and like reference numerals refer to like elements throughout the specification.

Hereinafter, display devices according to one or more exemplary embodiments will be described on the premise that they are a liquid crystal display ("LCD") device. However, the scope of the present inventive concept is not limited to the LCD device, and the present inventive concept may be applicable to organic light emitting diode ("OLED") display devices, for example.

Figure 2:
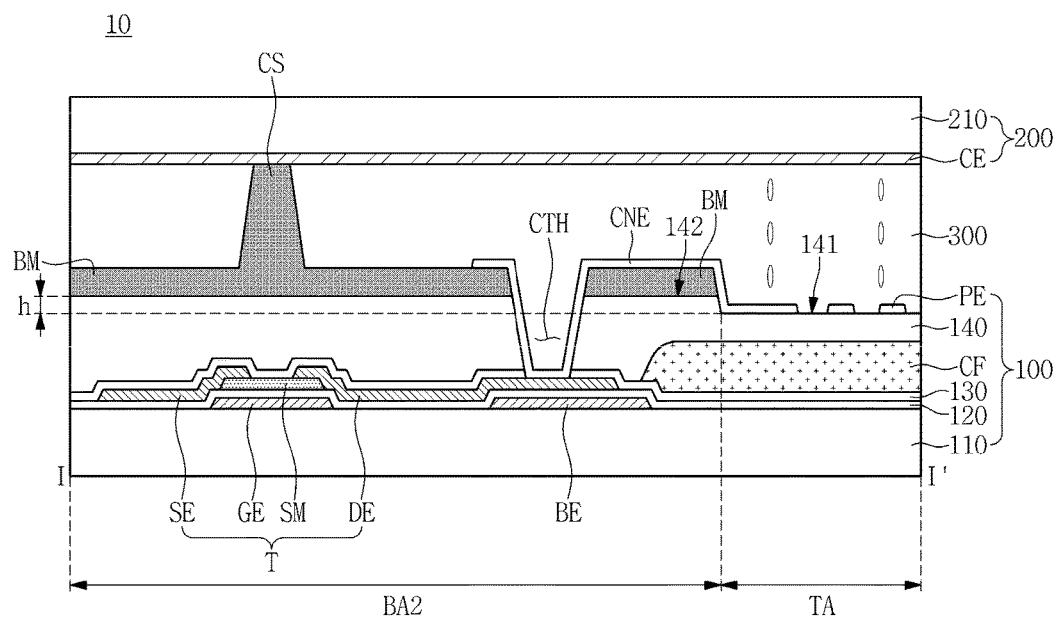
FIG. 2 is a cross-sectional view taken along line I-I' of FIG. 1.

FIG. 1 is a schematic plan view illustrating a display device according to an exemplary embodiment, and FIG. 2 is a cross-sectional view taken along line I-I' of FIG. 1.

Referring to FIGS. 1 and 2, a display device 10 according to an exemplary embodiment includes a plurality of pixels PX. Hereinafter, one pixel PX will be mainly described for ease of description.

A planar area of the pixel PX includes a first light blocking area BA1 extending in a first direction D1, a second light blocking area BA2 extending in a second direction D2 that intersects the first direction D1 and a light transmitting area TA defined by the first light blocking area BA1 and the second light blocking area BA2.

The first light blocking area BA1 and the second light blocking area BA2 are areas at which light provided from a light source is blocked and the light transmitting area TA is an area at which light provided from the light source is selectively transmitted.

A gate line GL may be disposed at the first light blocking area BA1 and a thin film transistor T, a data line DL, and the like may be disposed at the second light blocking area BA2. However, exemplary embodiments are not limited thereto, and the gate line GL, the data line DL, the thin film transistor T, and the like may be appropriately disposed at the first light blocking area BA1 and the second light blocking area BA2.

The thin film transistor T includes a gate electrode GE branching off from the gate line GL, a semiconductor layer SM disposed to overlap the gate electrode GE, a source electrode SE branching off from the data line DL and overlapping the semiconductor layer SM and a drain electrode DE spaced apart from the source electrode SE and overlapping the semiconductor layer SM.

The drain electrode DE is connected to the pixel electrode PE. For example, the drain electrode DE extends toward the pixel electrode PE and is electrically connected to a connection electrode CNE branching off from the pixel electrode PE through a contact hole CTH.

A light blocking pattern BE may be provided below a contact area of the drain electrode DE and the connection electrode CNE. The light blocking pattern BE may have a circular or polygonal shape in a plan view. The light blocking pattern BE may have an island shape or a shape extending from a storage wiring (not illustrated). The light blocking pattern BE may be disposed on a substantially same layer as a layer on which the gate line GL is disposed and may be formed through a substantially same process as a process in which the gate line GL is formed.

In addition, the light blocking pattern BE may be disposed so that at least a part of the light blocking pattern BE overlaps a black matrix BM to be described below. That is, the light blocking pattern BE may substantially prevent light leakage occurring in an area where the black matrix BM is removed.

The pixel electrode PE includes a cross-shaped stem portion, a plurality of branch portions extending from the stem portion and a connection electrode CNE extending from the cross-shaped stem portion. However, exemplary embodiments are not limited thereto, and the pixel electrode PE may have various shapes.

The pixel electrode PE according to an exemplary embodiment is depicted as having a longer length in the first direction D1 than a length in the second direction D2, but exemplary embodiments are not limited thereto. The pixel electrode PE may have a longer length in the second direction D2 than a length in the first direction D1.

The LCD device 10 according to an exemplary embodiment includes a display substrate 100, an opposing substrate 200 and a liquid crystal layer 300 disposed between the display substrate 100 and the opposing substrate 200.

The base substrate 110 may be an insulating substrate having light transmitting characteristics and flexible characteristics like a plastic substrate. However, exemplary embodiments are not limited thereto, and the base substrate 110 may include a hard substrate such as a glass substrate.

A gate wiring, such as the gate line GL, the gate electrode GE branching off from the gate line GL and the light blocking pattern BE, is disposed on the base substrate 110.

The gate wiring may include or be formed of aluminum (Al) or alloys thereof, silver (Ag) or alloys thereof, copper (Cu) or alloys thereof, molybdenum (Mo) or alloys thereof, chromium (Cr), tantalum (Ta) and titanium (Ti).

In addition, the gate wiring may have a multilayer structure including two or more conductive layers (not illustrated) having different physical properties. For example, a conductive layer of the multilayer structure may include or be formed of a metal having low resistivity to reduce signal delay or voltage drop, e.g., an aluminum (Al)-based metal, a silver (Ag)-based metal and a copper (Cu)-based metal, and another conductive layer of the multilayer structure may include a material that is found to impart excellent contact properties with indium tin oxide (ITO) and indium zinc oxide (IZO), e.g., a molybdenum-based metal, chromium, titanium and tantalum.

Examples of the multilayer structure may include a chromium lower layer and an aluminum upper layer, an aluminum lower layer and a molybdenum upper layer, and a titanium lower layer and a copper upper layer. However, exemplary embodiments are not limited thereto, and the gate wiring may include various kinds of metals and conductors. The gate wiring may be simultaneously formed in a substantially same process.

A first insulating layer 120 is disposed on the base substrate 110 on which the gate wiring is disposed. The first insulating layer 120 may be referred to as a gate insulating layer. The first insulating layer 120 may include silicon oxide (SiOx) or silicon nitride (SiNx). In addition, the first insulating layer 120 may further include aluminum oxide, titanium oxide, tantalum oxide or zirconium oxide.

The semiconductor layer SM is disposed on the first insulating layer 120. The semiconductor layer SM may include amorphous silicon or oxide semiconductor including at least one of gallium (Ga), indium (In), tin (Sn) and zinc (Zn). For example, the oxide semiconductor may include at least one selected from the group consisting of: zinc oxide (ZnO), zinc-tin oxide (ZTO), zinc-indium oxide (ZIO), indium oxide (InO), titanium oxide (TiO), indium-gallium-zinc oxide (IGZO) and indium-zinc-tin oxide (IZTO). Although not illustrated, an ohmic contact layer may be disposed on the semiconductor layer SM.

According to an exemplary embodiment, the semiconductor layer SM is depicted as substantially overlapping the gate electrode GE, but exemplary embodiments are not limited thereto. The semiconductor layer SM may be disposed so as to substantially overlap a data wiring to be described below.

The data wiring such as the data line DL, the source electrode SE and the drain electrode DE is disposed on the base substrate 110 on which the semiconductor layer SM is disposed. The data wiring may include a substantially same material as that included in the aforementioned gate wiring. The data wiring may be formed simultaneously in a substantially same process.

A second insulating layer 130 is disposed on the base substrate 110 on which the data wiring is disposed. The second insulating layer 130 is also referred to as an insulating interlayer. The second insulating layer 130 may have a monolayer structure or a multilayer structure including, for example, silicon oxide, silicon nitride, a photosensitive organic material or a low dielectric constant insulating material such as a-Si:C:O or a-Si:O:F.

A color filter CF may be disposed on the second insulating layer 130. The color filter CF may have a color of: red, green, blue, cyan, magenta, yellow and white. Three primary colors of red, green and blue, or cyan, magenta and yellow may define a basic pixel group for representing a color.

A protective layer 140 may be disposed on the base substrate 110 on which the color filter CF is disposed. The protective layer 140 may have a monolayer structure or a multilayer structure including, for example, silicon oxide, silicon nitride, a photosensitive organic material or a silicon-based low dielectric constant insulating material. The protective layer 140 may have a thickness ranging from about 1.0 µm to about 2.5 µm.

The protective layer 140 according to an exemplary embodiment includes a first protective layer 141 at the light transmitting area TA and a second protective layer 142 at the first light blocking area BA1 and the second light blocking area BA2. The first protective layer 141 may have a less height than a height of the second protective layer 142. For example, the first protective layer 141 and the second protective layer 142 may have a step difference h at a boundary. The step difference h may be from about 5000 Å to about 10000 Å. However, exemplary embodiments are not limited thereto, and the first protective layer 141 and the second protective layer 142 may have a substantially same height.

The black matrix BM may be disposed on the protective layer 140 at the first light blocking area BA1 and the second light blocking area BA2. The black matrix BM according to an exemplary embodiment is described on the premise that the black matrix BM is disposed at both of the first light blocking area BA1 and the second light blocking area BA2, but exemplary embodiments are not limited thereto. In an exemplary embodiment, the black matrix BM may be disposed only at one of the first light blocking area BA1 and the second light blocking area BA2. For example, the black matrix BM may be disposed only at the second light blocking area BA2, and the first light blocking area BA1 may be shielded by another component from light provided from the light source.

The black matrix BM may partially overlap or not overlap an edge of the pixel electrode PE to be described below. The black matrix BM substantially prevents a light, provided from the light source, from directed outwards, and prevents an external light from being irradiated to the gate line GL, the data line DL or the thin film transistor T.

The black matrix BM may include or be formed of a photosensitive composition. Examples of the photosensitive composition may include: a binder resin, a polymerizable monomer, a polymerizable oligomer, a pigment, a dispersant and a photoinitiator. The pigment may use a black pigment, a black resin, or the like.

The black matrix BM may have a thickness ranging from about 0.5 µm to about 2 µm. For example, the black matrix BM may have a thickness ranging from about 0.5 µm to about 1.5 µm.

The display device according to an exemplary embodiment may further include a column spacer CS protruding from the black matrix BM. The column spacer CS may be divided into a main column spacer or a sub-column spacer according to the height protruding from the black matrix BM. The main column spacer substantially supports the display substrate 100 and the opposing substrate 200 to secure a space, for example, a cell gap. When a pressure is externally applied to the main column spacer, the sub-column spacer distributes the pressure to provide buffering effect.

The pixel electrode PE may be disposed on the base substrate 110 on which the black matrix BM is formed. The pixel electrode PE may be disposed at the light transmitting area TA, and the connection electrode CNE branching off from the pixel electrode PE may be disposed at the second light blocking area BA2.

The connection electrode CNE may be connected to the drain electrode DE through the contact hole CTH defined through the black matrix BM, the protective layer 140 and the second insulating layer 130.

The pixel electrode PE and the connection electrode CNE may include a transparent conductive material. For example, the pixel electrode PE and the connection electrode CNE may include a transparent conductive material such as indium tin oxide (ITO), indium zinc oxide (IZO), indium tin zinc oxide (ITZO) and aluminum zinc oxide (AZO).

A lower alignment layer (not illustrated) may be disposed on the pixel electrode PE and the black matrix BM. The lower alignment layer may be a homeotropic alignment layer or a photoalignment layer including a photopolymerizable material.

The opposing substrate 200 may include an opposing base substrate 210, a common electrode CE, and the like.

The opposing base substrate 210 may be an insulating substrate having light transmitting characteristics and flexible characteristics like a plastic substrate. However, exemplary embodiments are not limited thereto, and the opposing base substrate 210 may include a hard substrate such as a glass substrate.

The common electrode CE may be a plate electrode formed to cover entire surface of the opposing base substrate 210 and including a transparent conductor such as indium tin oxide (ITO) and indium zinc oxide (IZO). In an alternative exemplary embodiment, the common electrode CE may have a concave-convex portion and at least one slit for defining a plurality of domains.

An upper alignment layer (not illustrated) may be disposed on the common electrode CE. The upper alignment layer (not illustrated) may be a homeotropic alignment layer or a photoalignment layer including a photopolymerizable material.

Figure 3A:
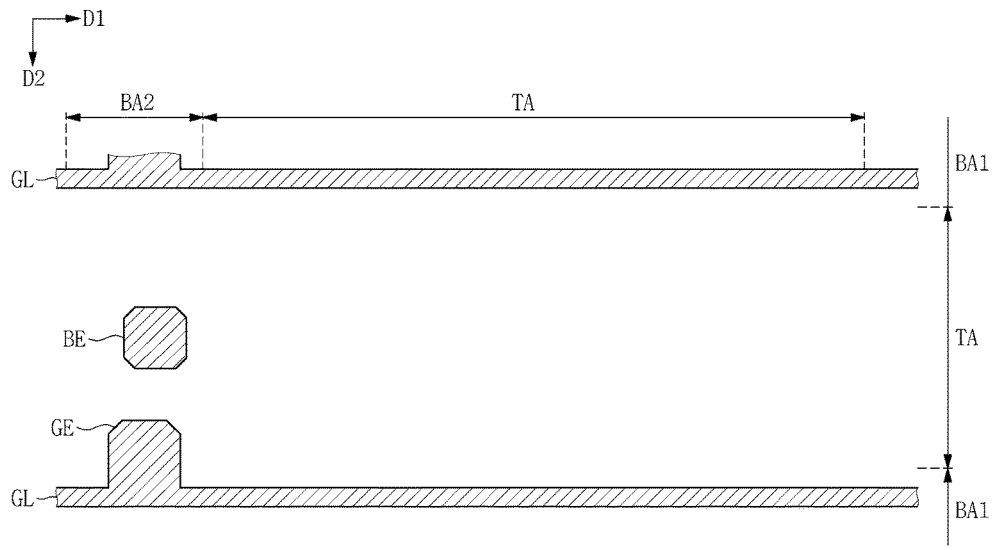
FIG. 3A is a plan view illustrating a gate wiring of a pixel illustrated in FIG. 1.
Figure 3B:
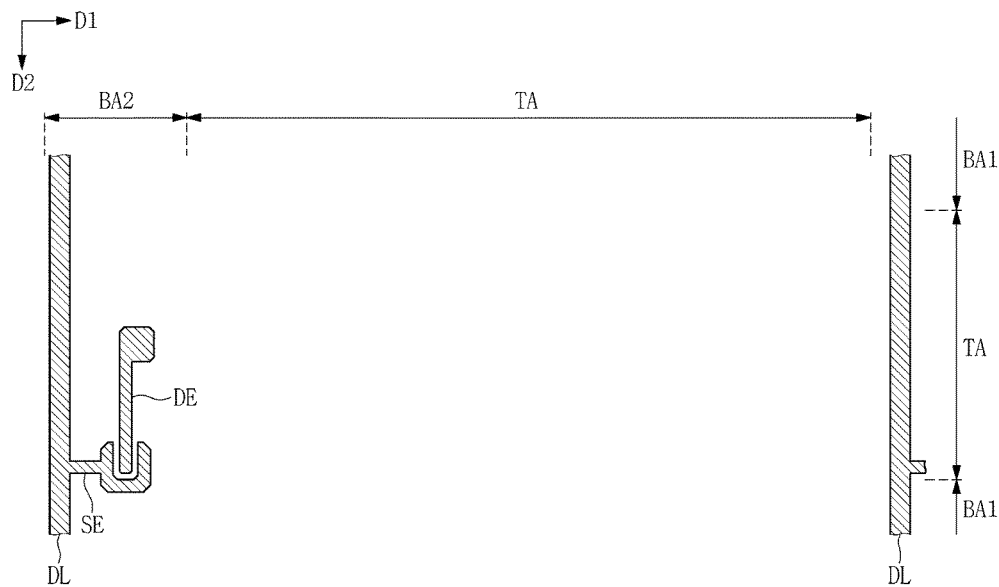
FIG. 3B is a plan view illustrating a data wiring of the pixel illustrated in FIG. 1.
Figure 3C:
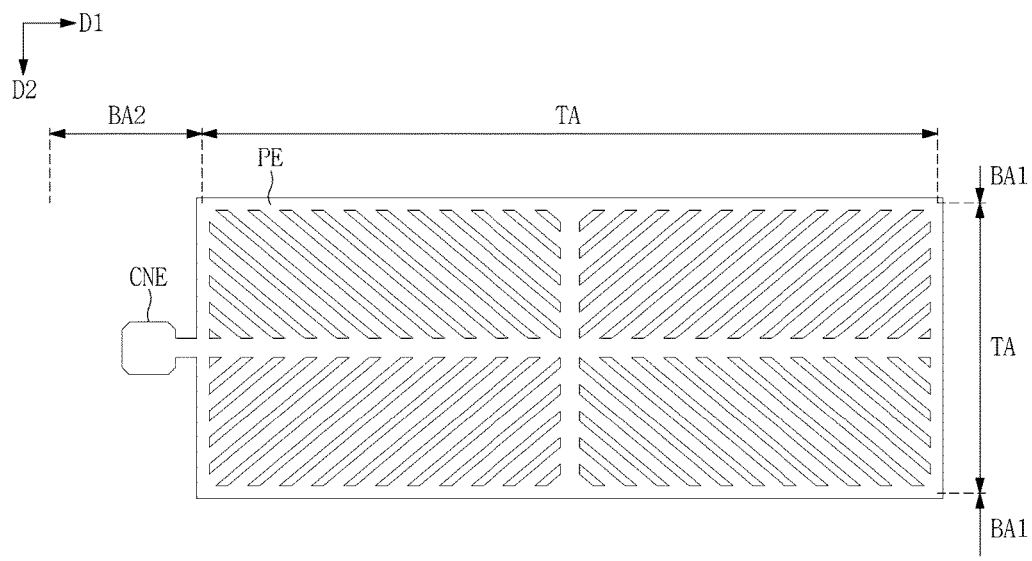
FIG. 3C is a plan view illustrating a pixel electrode of the pixel illustrated in FIG. 1.

FIG. 3A is a plan view illustrating the gate wiring of the pixel illustrated in FIG. 1, FIG. 3B is a plan view illustrating a data wiring of the pixel illustrated in FIG. 1, and FIG. 3C is a plan view illustrating the pixel electrode of the pixel illustrated in FIG. 1. FIGS. 4A, 4B, 4C, 4D, 4E and 4F are cross-sectional views illustrating a method of manufacturing a display device according to an exemplary embodiment.

Figure 4A:
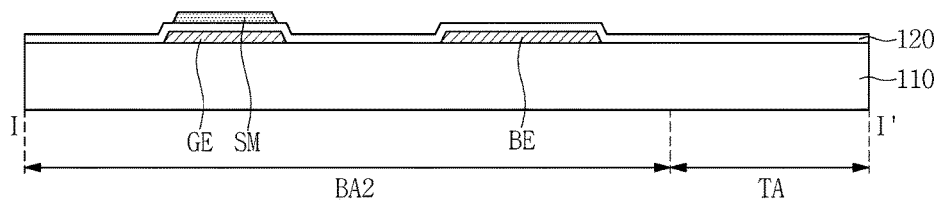
FIGS. 4A, 4B, 4C, 4D, 4E and 4F are cross-sectional views illustrating a method of manufacturing a display device according to an exemplary embodiment.

Referring to FIGS. 3A and 4A, the gate wiring including the gate line GL, the gate electrode GE and the light blocking pattern BE is formed on the base substrate 110 including transparent glass or plastic. The gate wiring may be formed in a substantially same layer and may be formed in a substantially same process.

The first insulating layer 120 is formed on the base substrate 110 on which the gate wiring is formed. The first insulating layer 120 may be formed through a chemical vapor deposition process, a spin coating process, a sputtering process, a vacuum deposition process, a printing process, or the like.

The semiconductor layer SM overlapping at least a part of the gate electrode GE is formed on the base substrate 110 on which the first insulating layer 120 is formed.

Figure 4B:
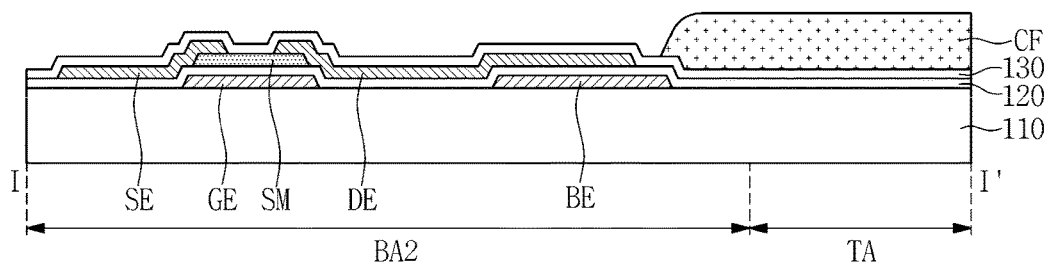

Referring to FIGS. 3B and 4B, the data wiring including the data line DL, the source electrode SE and the drain electrode DE is formed on the base substrate 110 on which the semiconductor layer SM is formed. The source electrode SE may be formed to overlap one end of the semiconductor layer SM and the drain electrode DE may be spaced apart from the source electrode SE and overlap another end of the semiconductor layer SM.

The second insulating layer 130 is formed on the base substrate 110 on which the data wiring is formed. The second insulating layer 130 may be formed through a chemical vapor deposition process, a spin coating process, a sputtering process, a vacuum deposition process, a printing process, or the like. Then, the color filter CF may be formed on the second insulating layer 130.

Figure 4C:
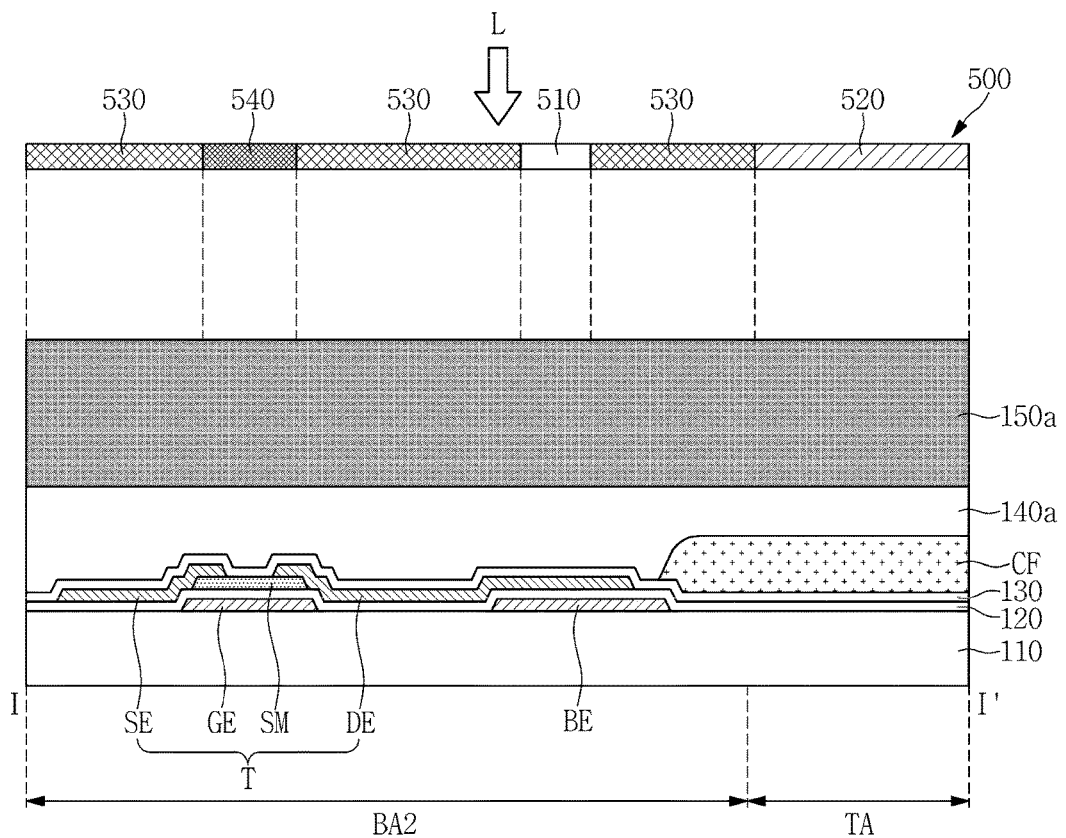

Referring to FIG. 4C, a protective layer forming material 140a and a black matrix forming material 150a are sequentially formed on the base substrate 110 on which the color filter CF is formed.

The protective layer forming material 140a and the black matrix forming material 150a may be formed through a chemical vapor deposition process, a spin coating process, a sputtering process, a vacuum deposition process, a printing process, or the like.

The protective layer forming material 140a may include silicon oxide, silicon nitride, a photosensitivity organic material, a silicon-based low dielectric constant insulating material, or the like. The protective layer forming material 140a according to an exemplary embodiment is assumed to be a positive type photosensitive organic material in which an exposed portion is developed and a non-exposed portion remains.

The black matrix forming material 150a may include a photosensitive composition such as a binder resin, a polymerizable monomer, a polymerizable oligomer, a pigment, a dispersant, a photoinitiator, and the like. The black matrix forming material 150a according to an exemplary embodiment is assumed to be a positive type photosensitive organic material in which an exposed portion is developed and a non-exposed portion remains.

Subsequently, a mask 500 is disposed on the base substrate 110, spaced apart from the base substrate 110. The mask 500 is a 4 tone mask including, for example, a light transmitting portion 510, a first semi-light transmitting portion 520, a second semi-light transmitting portion 530 and a light blocking portion 540, each having different light transmittances. In an alternative exemplary embodiment, the mask 500 may include a slit portion instead of the semi-light transmitting portions 520 and 530.

The light transmitting portion 510 may have a light transmittance of about 95% or more, and the light blocking portion 540 may have a light transmittance of about 5% or less. The semi-light transmitting portions 520 and 530 may have a light transmittance ranging from about 15% to about 30%, and the first semi-light transmitting portion 520 may have a higher light transmittance than that of the second semi-light transmitting portion 530.

The light transmitting portion 510 may be located above the light blocking pattern BE in a plan view, the first semi-light transmitting portion 520 may be located above the light transmitting area TA in a plan view, the second semi-light transmitting portion 530 may be located above the first light blocking area BA1 and the second light blocking area BA2 in a plan view, and the light blocking portion 540 may be located above a column spacer forming area in a plan view. In an alternative exemplary embodiment, a 5 tone mask may be used when forming two column spacers of different heights, for example, a main column spacer and a sub column spacer.

Subsequently, a light L is irradiated using the mask 500, disposed above the base substrate 110, and development and curing processes are performed.

Figure 4D:
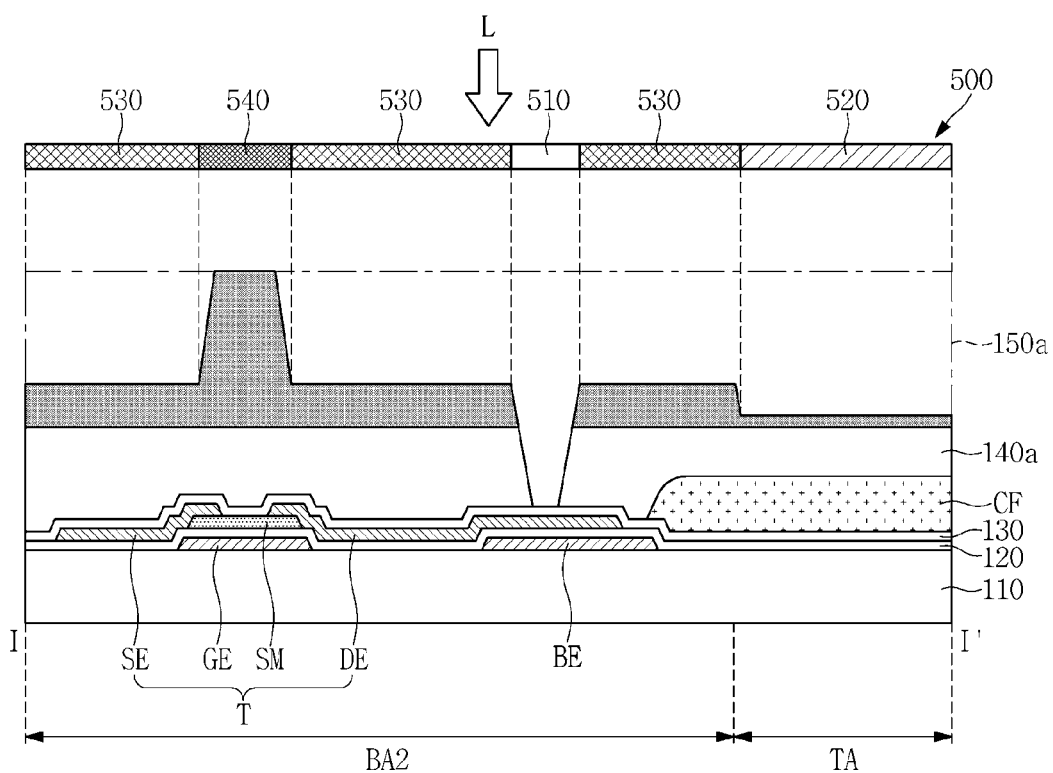

Referring to FIG. 4D, the black matrix forming material 150a and the protective layer forming material 140a located below the light transmitting portion 510 are both fully developed to expose the second insulating layer 130. The black matrix forming material 150a located below the first semi-light transmitting portion 520, the second semi-light transmitting portion 530 and the light blocking portion 540 remains but has different thicknesses, respectively. The thickness of the black matrix forming material 150a located below the first semi-light transmitting portion 520 is the smallest and the thickness of the black matrix forming material 150a located below the light blocking portion 540 is the largest.

Figure 4E:
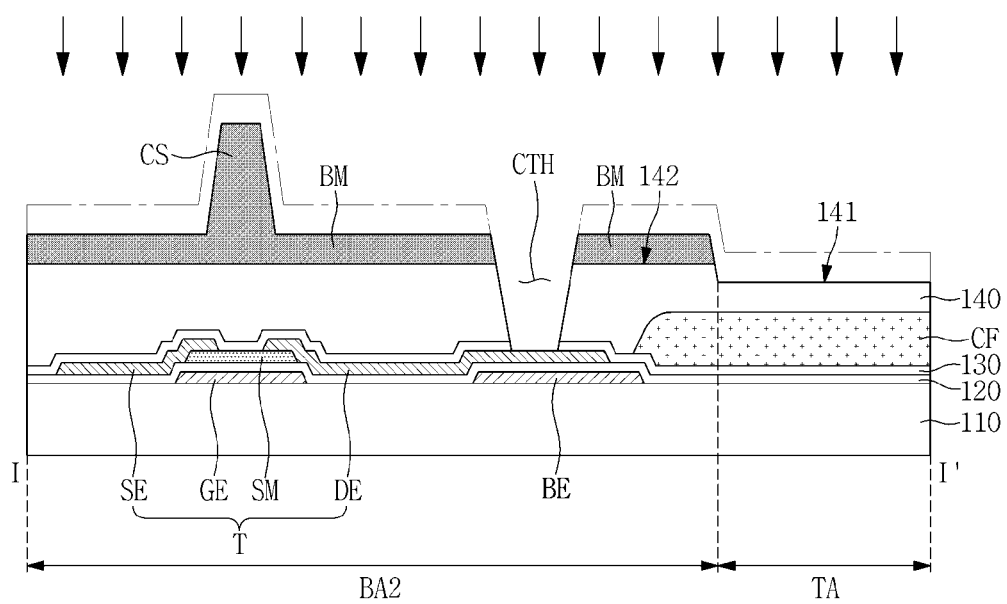

Referring to FIG. 4E, an entire surface of the base substrate 110 may be collectively etched using the remaining black matrix forming material 150a as an etch prevention layer. Accordingly, the exposed second insulating layer 130 is removed and a contact hole CTH exposing a part of the drain electrode DE is defined. Further, the remaining black matrix forming material 150a is partly removed to form the black matrix BM, the column spacer CS, or the like. The black matrix BM may be formed to a thickness ranging from about 0.5 μm to about 2 μm, and the column spacer CS may be formed to a height ranging from about 1.5 μm to about 4 μm.

In such an exemplary embodiment, since the thickness of the black matrix forming material 150a remaining in the light transmitting area TA is thin, the protective layer forming material 140a of the light transmitting area TA may be partially etched together with the black matrix forming material 150a.

Accordingly, the first protective layer 141 of the light transmitting area TA may have a less height than a height of the second protective layer 142 of another area (e.g., the second light blocking area BA2). In this process, the black matrix forming material 150a on the light transmitting area TA may be completely removed.

Figure 4F:
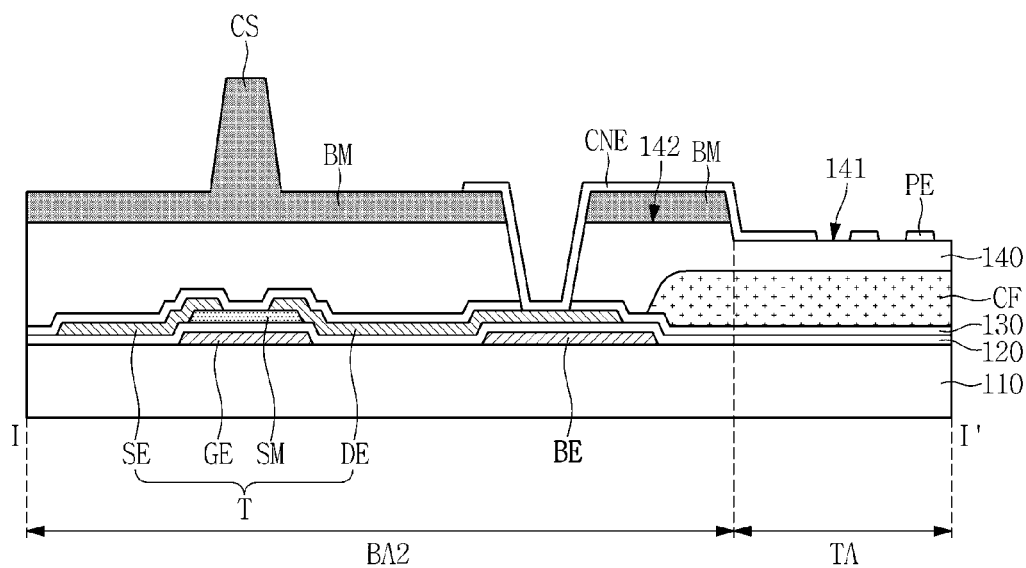

Referring to FIGS. 3C and 4F, the pixel electrode PE is formed on the base substrate 110 on which the black matrix BM is formed. The pixel electrode PE is formed at the light transmitting area TA, and the connection electrode CNE branching off from the pixel electrode PE is connected to the drain electrode DE through the contact hole CTH.

As set forth hereinabove, in the display device according to one or more exemplary embodiments, a process of removing the black matrix remaining on the pixel electrode may not be necessary by forming the pixel electrode after forming the black matrix.

According to one or more exemplary embodiments, the manufacturing process may be simplified by forming the protective layer and the black matrix in a single process.

While the present inventive concept has been illustrated and described with reference to the exemplary embodiments thereof, it will be apparent to those of ordinary skill in the art that various changes in form and detail may be made thereto without departing from the spirit and scope of the present inventive concept.

What is claimed is:

1. A display device comprising:
  a base substrate comprising a first light blocking area extending in a first direction, a second light blocking area extending in a second direction intersecting the first direction and a light transmitting area defined by the first light blocking area and the second light blocking area;

a gate line disposed on the base substrate at the first light blocking area;

a data line disposed on the base substrate at the second light blocking area;

a thin film transistor connected to the gate line and the data line;

a protective layer disposed on the thin film transistor;

a black matrix disposed on the protective layer at at least one of the first light blocking area and the second light blocking area; and a pixel electrode disposed on the black matrix and connected to the thin film transistor through a contact hole of the protective layer and the black matrix.

2. The display device as claimed in claim 1, further comprising a light blocking pattern disposed on the base substrate and overlapping an area at which the thin film transistor contacts the pixel electrode.

3. The display device as claimed in claim 2, wherein the light blocking pattern overlaps at least a part of the black matrix.

4. The display device as claimed in claim 3, wherein the entire area at which the thin film transistor contacts the pixel electrode overlaps the light blocking pattern in a plan view.

5. The display device as claimed in claim 2, wherein the light blocking pattern is disposed in a same layer as a layer in which the gate line is disposed.

6. The display device as claimed in claim 2, wherein the light blocking pattern has an island shape.

7. The display device as claimed in claim 2, wherein the light blocking pattern has a circular or polygonal shape.

8. The display device as claimed in claim 1, wherein the protective layer comprises a first protective layer at the light transmitting area and a second protective layer at the first light blocking area and the second light blocking area, and
wherein the first protective layer has a less height than a height of the second protective layer.

9. The display device as claimed in claim 8, wherein the first protective layer and the second protective layer has a step difference at a boundary.

10. The display device as claimed in claim 9, wherein the step difference is from about 5000 Å to about 10000 Å.

11. The display device as claimed in claim 1, further comprising a column spacer protruding from the black matrix.

12. A method of manufacturing a display device, the method comprising:
preparing a base substrate comprising a first light blocking area extending in a first direction, a second light blocking area extending in a second direction intersecting the first direction and a light transmitting area defined by the first light blocking area and the second light blocking area;

forming a gate line on the base substrate at the first light blocking area;

forming a data line on the base substrate at the second light blocking area;

forming a thin film transistor connected to the gate line and the data line;

forming a protective layer and a black matrix on the thin film transistor; and forming a pixel electrode connected to the thin film transistor through a contact hole of the protective layer and the black matrix.

13. The method as claimed in claim 12, wherein the forming a protective layer and the black matrix comprises:
sequentially forming a protective layer forming material and a black matrix forming material;

exposing the black matrix forming material using a mask comprising a light transmitting portion, a semi-light transmitting portion and a light blocking portion; and developing the black matrix forming material.

14. The method as claimed in claim 13, further comprising:
forming an insulating layer on the data line, and etching the insulating layer using the developed black matrix forming material as an etching mask to expose a drain electrode of the thin film transistor.

15. The method as claimed in claim 14, further comprising:
partially removing the developed black matrix forming material on the first light blocking area and the second light blocking area, and completely removing the developed black matrix forming material on the light transmitting area.

16. The method as claimed in claim 15, further comprising:
partially removing the protective layer on the light transmitting area.

17. The method as claimed in claim 13, wherein the protective layer comprises a first protective layer at the light transmitting area and a second protective layer at the first light blocking area and the second light blocking area, and
wherein the first protective layer has a less height than a height of the second protective layer.

18. The method as claimed in claim 13, further comprising forming a light blocking pattern on the base substrate and overlapping an area at which the thin film transistor contacts the pixel electrode.

19. The method as claimed in claim 17, wherein the light blocking pattern is formed in a same process as a process in which the gate line is formed.

20. The method as claimed in claim 19, wherein an entire area at which the thin film transistor contacts the pixel electrode overlaps the light blocking pattern in a plan view.

21. The display device as claimed in claim 1, wherein a portion of the black matrix is disposed between the pixel electrode and the protective layer.

* * * * *